US006837928B1

(12) United States Patent
Zhang et al.

(10) Patent No.: US 6,837,928 B1
(45) Date of Patent: Jan. 4, 2005

(54) ELECTRIC FIELD ORIENTATION OF CARBON NANOTUBES

(75) Inventors: Yuegang Zhang, Cupertino, CA (US); Hongjie Dai, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/233,058

(22) Filed: Aug. 30, 2002

Related U.S. Application Data

(60) Provisional application No. 60/316,558, filed on Aug. 30, 2001.

(51) Int. Cl.[7] ........................... C30B 25/02; C30B 25/04
(52) U.S. Cl. ............................... 117/95; 117/89; 117/94
(58) Field of Search ............................... 117/84, 89, 94, 117/95

(56) References Cited

U.S. PATENT DOCUMENTS 6,250,984 B1 * 6/2001 Jin et al. ...................... 445/51

* cited by examiner

Primary Examiner—Felisa Hiteshew

(57) ABSTRACT

Carbon nanotubes are implemented in a manner that facilitates their orientation and arrangement for a variety of applications. According to an example embodiment of the present invention, an electric field is used to orient carbon nanotubes along a direction of the electric field (e.g., along a direction generally parallel to an electric field applied between two electrodes). In one implementation, the electric field is used to orient a nanotube that has already been grown. In another implementation, the electric field is used in situ, with nanotubes being aligned while they are grown. With these approaches, carbon nanotubes can be selectively oriented for one or more of a variety of implementations. Furthermore, arrays of aligned carbon nanotubes can be formed extending between circuit nodes having both similar and different orientations.

31 Claims, 8 Drawing Sheets

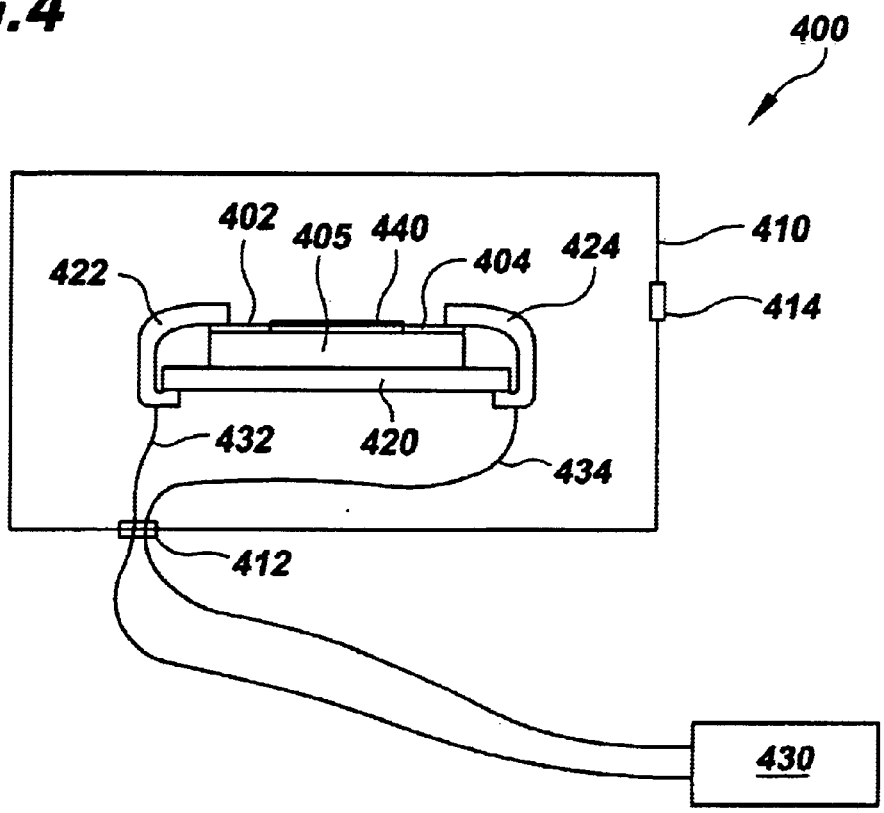

610

620

630

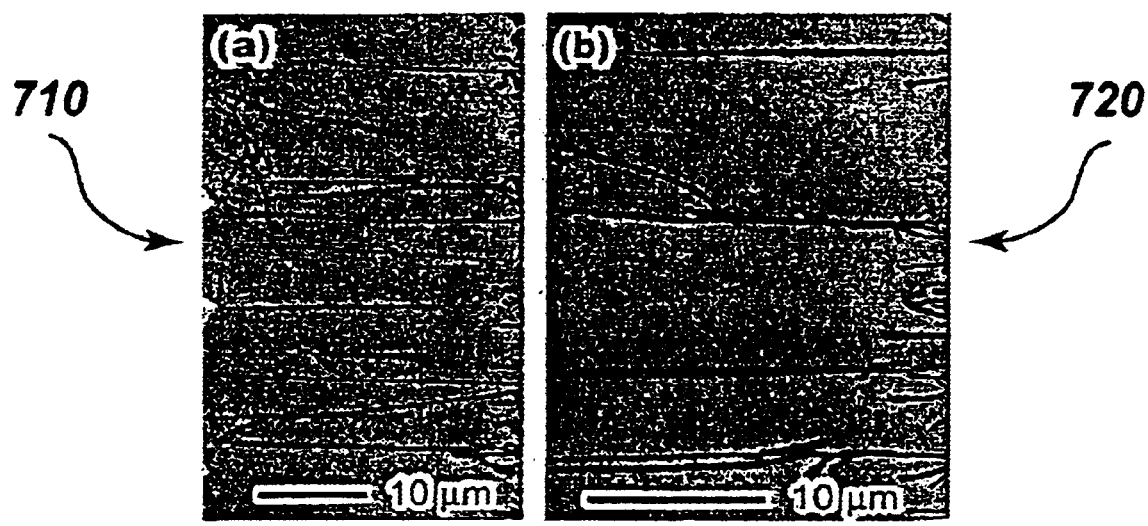

ELECTRIC FIELD ORIENTATION OF CARBON NANOTUBES

RELATED PATENT DOCUMENTS

This patent document is a continuation of U.S. Provisional Patent Application Serial No. 60/316,558, filed on Aug. 30, 2001 and entitled "Electric Field Orientation of Carbon Nanotubes," to which priority is claimed under 35 U.S.C. §120 for common subject matter. This patent document also relates to U.S. patent application Ser. No. 09/133,948 (STFD.021PA/S98-049), filed on Aug. 14, 1998, entitled "Carbon Nanotube Structures Made Using Catalyst Islands," and which claims priority to U.S. Provisional Application Serial No. 60/171,200, filed on Dec. 15, 1999, all of which are fully incorporated herein by reference.

FIELD OF THE INVENTION

The present invention relates generally to carbon nanotubes and, more particularly, to electric field-assisted orientation of carbon nanotubes.

BACKGROUND

Carbon nanotubes are unique carbon-based, molecular structures that exhibit interesting and useful electrical properties. There are two general types of carbon nanotubes, referred to as multi-walled carbon nanotubes (MWNTs) and single-walleded carbon nanotubes (SWNTs). SWNTs have a cylindrical sheet-like, one-atom-thick shell of hexagonally-arranged carbon atoms, and MWNTs are typically composed of multiple coaxial cylinders of ever-increasing diameter about a common axis. Thus, SWNTs can be considered to be the structure underlying MWNTs and also carbon nanotube ropes, which are uniquely-arranged arrays of SWNTs.

Single-walleded carbon nanotubes (SWNTs) exhibit interesting and useful electrical properties, and may be utilized for a variety of devices, such as integrated molecular electronic devices and others. In order to achieve such integration, it is often desirable to assemble individual SWNTs into desired architectures on substrates by placing them at specific locations with controlled orientations. One approach to the assembly of nanotubes includes controlled chemical synthesis. In this regard, patterned growth by chemical vapor deposition (CVD) can be used to control the locations of SWNTs on large flat substrates and on three-dimensional (3D) surface structures.

Accurately controlling the orientations of SWNTs continues to present challenges to the implementation of SWNTs in a variety of applications. For example, post-growth manipulation and assembly of SWNTs has not been very successful thus far due to factors including poor SWNT solubility in liquids and significant amounts of impurity particles in the nanotube materials. In addition, factors such as thermal and gas flow randomization can result in nanotube materials being formed in undesirable arrangements. Furthermore, when growing carbon nanotubes close to a substrate, the forces between the substrate and the carbon nanotubes tend to pull the nanotubes to the substrate as they are grown. These and other factors have presented challenges to the production of oriented nanotubes and to their integration with molecular electronic devices and others.

SUMMARY OF THE INVENTION

The present invention is directed to overcoming the above-mentioned challenges and others related to carbon nanotubes, carbon nanotube devices and their implementation. The present invention is exemplified in a number of implementations and applications, some of which are summarized below.

According to an example embodiment of the present invention, an electric field is used to direct the orientation of nanotubes, such as single-walleded carbon nanotubes free, suspended and/or formed on a substrate. In connection with this example embodiment, it has been discovered that the high polarizability of nanotubes makes their orientation susceptible to influence by an electric field. In this regard, an electric field is used to align nanotubes during growth and/or during post-growth assembly thereof, with the resulting nanotubes having an orientation that is related to the application of the electric field. With this approach, challenges including those discussed above to the orientation of nanotubes can be addressed.

According to another example embodiment of the present invention, aligned nanotubes on flat substrates are obtained by growing nanotubes from elevated structures in the presence of one or more electric fields. In one implementation, an elevated structure is formed on a substrate, such as silicon. An electric field is applied to the substrate and nanotubes are grown from the elevated structure, using one or more methods for growth of the carbon nanotubes. With one approach, the nanotubes are grown suspended over the substrate, and with another approach, the nanotubes are grown on the substrate (e.g., grown first extending over the substrate, aligned and subsequently pulled to the substrate using van der Waals forces).

In one instance, an elevated structure including a catalyst material that promotes carbon nanotube growth is formed on a substrate, and a methane-containing gas is introduced to the catalyst material while the electric field is being applied thereto. The methane gas reacts to begin growth of carbon nanotubes in an aligned fashion with respect to the electric field. With this approach, carbon nanotubes are grown from a known location (e.g., from the catalyst material) and extend in a direction controlled by the electric field. This approach is particularly useful, for example, for forming carbon nanotubes extending in a desired orientation for implementation in molecular circuits and sensors, as well as for implementation in structural applications.

The above summary of the present invention is not intended to describe each illustrated embodiment or every implementation of the present invention. The figures and detailed description that follow more particularly exemplify these example embodiments.

BRIEF DESCRIPTION OF THE DRAWINGS

The invention may be more completely understood in consideration of the detailed description of various embodiments of the invention that follows in connection with the accompanying drawings, in which:

FIGS. 2A–2D show a carbon nanotube device at various stages of manufacture, according to another example embodiment of the present invention, in which:

FIG. 2A shows a substrate for use in growing carbon nanotubes;

FIG. 2B shows the substrate of FIG. 2A having been patterned;

FIG. 2C shows a the substrate of FIG. 2B having catalyst disposed thereon; and

FIG. 2D shows a carbon nanotube device formed using the substrate shown in FIG. 2C;

FIG. 4 is a system for electric-field directed growth of carbon nanotubes, according to another example embodiment of the present invention;

FIG. 7 shows single-walled nanotubes at the bottom of the trenches grown under an applied DC voltage, in connection with another example embodiment of the present invention.

Figure 1A:
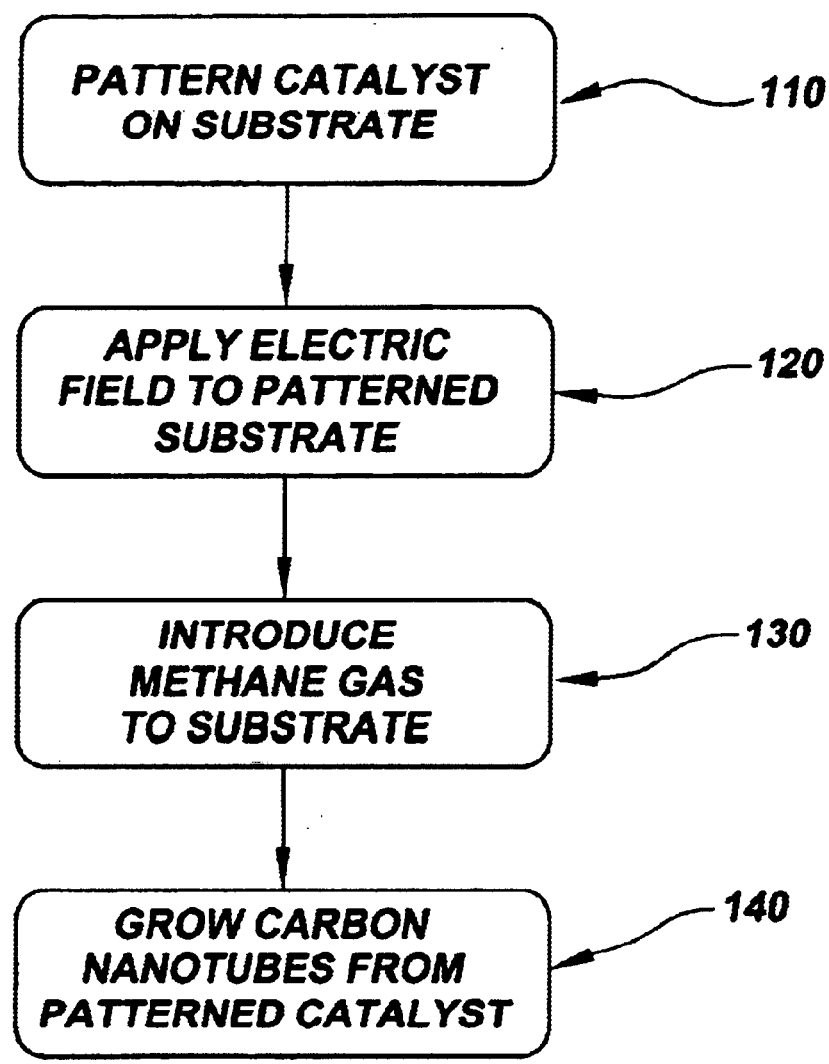
FIG. 1A is a flow diagram for electric field directed growth of carbon nanotubes, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of nanotubes and nanotube devices, and the invention has been found to be particularly suited for manufacturing aligned carbon nanotubes. While the present invention is not necessarily limited to such applications, various aspects of the invention may be appreciated through a discussion of various examples using this context.

According to an example embodiment of the present invention, nanotubes are manufactured using electric field alignment in connection with nanotube growth approaches including controlled chemical synthesis and others. The nanotubes are oriented along the direction of the electric field, and in various implementations, are suspended over surface trench structures, formed on a substrate and/or grown from elevated structures onto flat substrates. With this approach, carbon nanotubes, such as individual SWNTs, can be assembled into desired architectures on substrates, for example, by placing them at specific locations with controlled orientations. These carbon nanotubes are adaptable for use in a variety of structural, electronic and other applications, such as ordered molecular wire architectures and those employing nanotube networks on surfaces.

In a more particular example embodiment of the present invention, large dipole moments are induced by electric fields that are on the order of between about 1–2 Volts/micron during nanotube synthesis. It has been discovered that these dipole moments lead to relatively large aligning torques and forces on nanotubes being grown. The aligning torques and forces prevent the randomization of the orientation of the nanotubes as they are grown, which typically occurs due to factors such as thermal fluctuations and gas flows present during nanotube growth.

According to another example embodiment of the present invention, as-grown nanotubes are aligned and assembled using an electric field. An electric field is applied to one or more nanotubes, which respond by aligning themselves to the electric field. The nanotubes are then assembled, such as by connecting opposite ends of a nanotube to circuit nodes, wherein the nanotube is implemented as a molecular wire. With this approach, the orientation of manufactured nanotubes can be accurately controlled for their implementation in a variety of applications. Moreover, this approach is applicable to a variety of nanotube and nanotube-device manufacturing processes.

FIG. 1A is a flow diagram for carbon nanotube growth, according to another example embodiment of the present invention. At block 110, a catalyst material is patterned on a substrate, such as silicon, alumina, quartz, silica and silicon nitride. The composition of the catalyst material is selected for the particular application, and may include, for example, one or more of iron, molybdenum, cobalt, nickel, ruthenium, zinc and oxides thereof. The patterned locations of the catalyst material are selected for the particular application to which carbon nanotubes grown from the catalyst material are to be implemented. For example, when implemented in connection with a molecular species sensor, the catalyst material is patterned in an array that is conducive for both electrical access to the subsequently-grown carbon nanotubes and exposure of the carbon nanotube to molecules being sensed. A change in an electrical characteristic of the carbon nanotube can be detected and interpreted for detecting its exposure to the molecules being sensed. Similarly, when the subsequently-grown carbon nanotubes are to be implemented in a molecular circuit (e.g., an integrated circuit), the catalyst is patterned to correspond to a desired location of the carbon nanotube, for instance, for electrical access as a molecular wire and/or for access by a gate or other electronic device.

After the catalyst material is patterned, an electric field is applied to the substrate at block 120. The orientation of the electric field is controlled to direct the concurrent growth of carbon nanotubes from the patterned catalyst material in a selected direction, such as for the sensor or molecular circuit applications discussed above. At block 130, methane-based gas is introduced to the catalyst-patterned substrate, and carbon nanotubes are grown using the methane gas and patterned catalyst at block 140. For more information regarding nanotubes in general, and for specific information regarding nanotube devices, growth and materials and arrangements used therefor (e.g., such as catalyst materials, substrate materials, growth conditions and system) that may be implemented in connection with the present invention, reference may be generally to the above-mentioned patent documents, and also to: "Carbon Nanotubes: Synthesis, Structure, Properties and Applications," M. S. Dresselhaus, G. Dresselhaus and Ph. Avouris (Eds.), Springer-Verlag Berlin Heidelberg, New York, 2001, which is fully incorporated herein by reference.

Figure 1B:
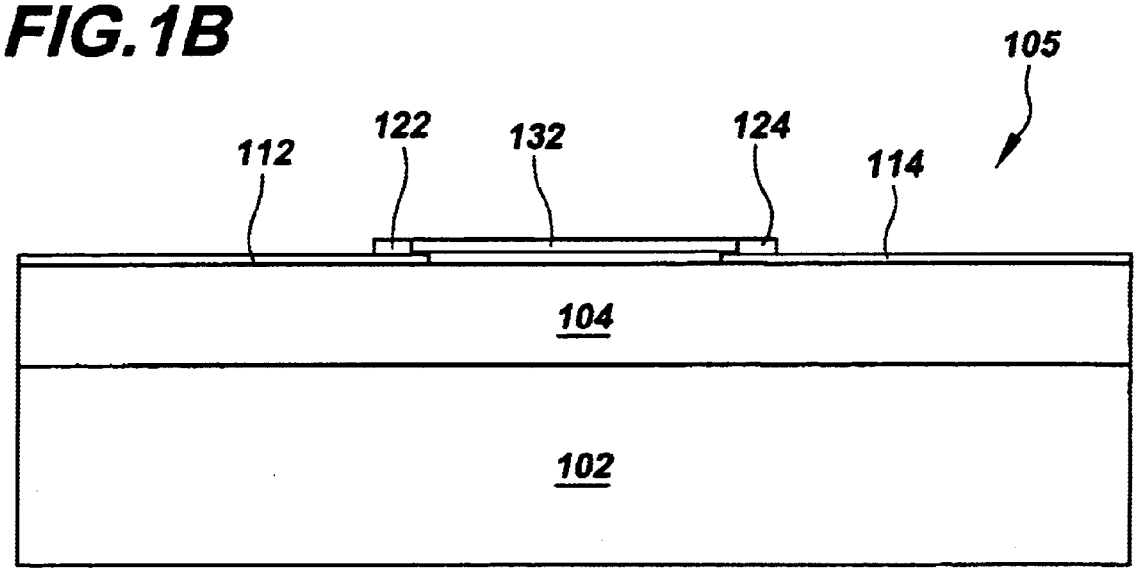
FIG. 1B is an arrangement for growing aligned carbon nanotubes over a substrate, according to another example embodiment of the present invention.

FIG. 1B shows an arrangement 105 that may be implemented in connection with carbon nanotube alignment as discussed, for example, in connection with FIG. 1A, according to another example embodiment of the present invention. The arrangement 105 includes a substrate 102 with an insulating layer 104 thereon. The substrate 102 may, for example, include silicon or other similar substrates, with the insulating layer 104 including a thermally-insulating material, such as oxide. Electrodes 112 and 114 are disposed on the insulating layer 104, and are made using conductive material such as molybdenum or other metal. Catalyst material portions 122 and 124 are formed on the electrodes 112 and 114, respectively, with the electrodes being adapted for coupling to a power source for applying an electric field between the catalyst islands. A nanotube 132 is then subsequently grown between the catalyst material portions 122 and 124, using the electric field applied via the electrodes 112 and 114. In one implementation, the electric field and insulating layer 104 are adapted for growing the nanotube 132 such that it subsequently falls onto the insulating layer 104, after being aligned during growth.

The arrangement 105 shown in FIG. 1B can be implemented using a variety of approaches. In one implementation, the substrate 102 is a silicon wafer and the insulating layer 104 is a silicon oxide substrate having a thickness of about 1.85 microns. The electrodes 112 and 114 are patterned (e.g., using photolithography and liftoff) having a length, width and height of about 0.8 cm, 0.3 cm and 50–100 nm, respectively, with a space between the electrodes of about 10 microns. The catalyst material portions 122 and 124 are patterned as strips at about 5 microns high and 0.4 cm in length. A voltage of between about 3V and 20V is applied to the electrodes 112 and 114, with a resistor (e.g., 40 k$\Omega$) being used to limit current. The nanotube 132 is then grown in a CVD chamber at about 900 degrees Celsius using about 720 mL/min of methane gas flow, 500mL/min of hydrogen gas flow and 12 mL/min of ethylene gas flow, for about 2 minutes. Pure hydrogen gas is also flowed into the CVD chamber during heating and cooling steps and used to inhibit oxidation of the electrodes 112 and 114.

In one implementation, the catalyst material portions 122 and 124 are patterned using a double-layer photolithography approach, wherein an upper layer (e.g., conventional photoresist) is patterned using a conventional photolithography approach and wells are formed in a lower layer (e.g., poly(methylmethacrylate), PMMA) via plasma etching. The upper layer is then removed via exposure to a high flux of light and subsequent development. Catalyst material is then deposited from a methanol suspension into the patterned lower layer, which is followed by liftoff of the lower layer.

Figure 2A:
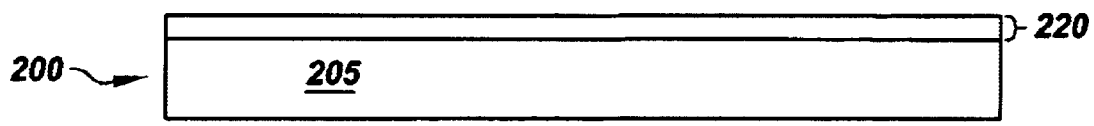
Figure 2B:
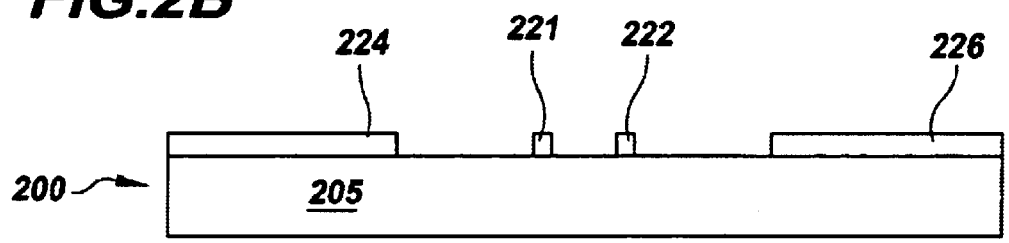

FIGS. 2A–2D show a SWNT device 200 at various stages of manufacture, according to another example embodiment of the present invention. In FIG. 2A, a polysilicon film 220 having a thickness of about 3 microns is grown on an insulative wafer 205, such as a quartz wafer and/or a wafer having silicon oxide on silicon. The polysilicon film 220 is then patterned, for example, using photolithography and plasma etching to form three parallel trenches in the polysilicon film 220 as shown in FIG. 2B. The three trenches are bordered by polysilicon film portions 221 and 222 having a width of about 5 microns and portions 224 and 225 having a width of about 0.5 cm. The trench widths are in the range of between about 10–40 microns.

Figure 2C:
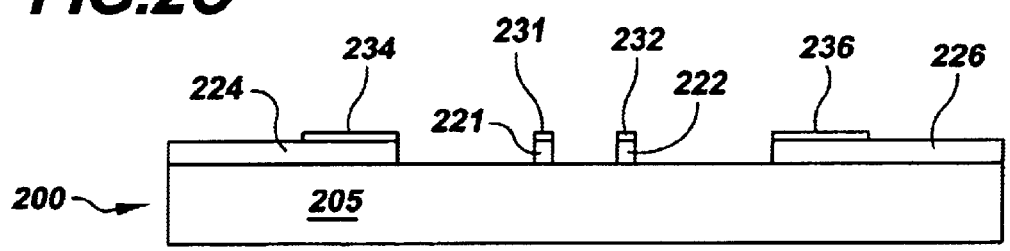

In FIG. 2C, a liquid-phase catalyst precursor film is transferred onto the patterned polysilicon film portions, resulting in catalyst portions 231, 231, 234 and 236, as shown. The catalyst precursor film may be formed, for example, using contact printing with a poly (e.g., dimethylsiloxane) elastomer stamp. The device 200 is then calcined at 300° C. for about 12 hours in air to remove organic components, resulting in catalyst nanoparticles supported on mesoporous alumina frames on the elevated polysilicon structures 221, 222, 224 and 226. For general information regarding catalyst preparation, and for specific information regarding example formation of the catalyst structure shown in FIG. 2C and other implementations to which the present invention is applicable, reference may be made to A. Cassell, N. Franklin, T. Tombler, et al., J. Am. Chem. Soc. 121, 7975 (1999) and to N. Franklin and H. Dai, Adv. Mater. 12, 890 (2000), both of which are fully incorporated herein by reference.

Figure 2D:
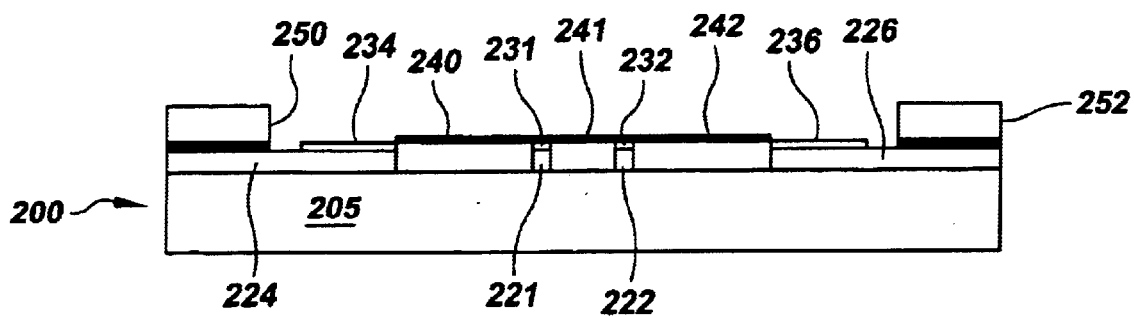

In FIG. 2D, the device 200 is mounted on an insulating fixture (e.g., a ceramic fixture, not shown) with two metal leads 250 and 252 clamped onto the outer polysilicon portions 224 and 226, and placed into a CVD system including a 1" tube furnace adapted for SWNT growth. In the CVD system, a DC (e.g., 0–200 volts) or AC (e.g., 30 MHz, 10 volts peak-to-peak) voltage is applied to the metal leads 250 and 252 using electrical feedthrough connectors. Electric fields are established across all of the three trenches and SWNTs 240, 241 and 242 are grown at 900° C. in the flow of about 500 sccm of methane mixed with about 200 sccm of hydrogen for about 4 min in the tube-furnace. In one implementation, the catalyst portions 234 and 236 are used as electrodes (e.g., wherein the catalyst portions include conductive material, such as molybdenum), with the electric field being established across the catalyst portions.

In another example embodiment of the present invention, scanning electron microscopy (SEM) is used to examine the alignment of SWNTs grown in an electric field, as discussed above. In one implementation, 5 nm of titanium, followed by 15 nm of gold, is deposited on the carbon nanotubes grown using electric-field orientation, prior to imaging via SEM. The SEM images obtained of the SWNTs can be used, for example, for inspection and other purposes, such as circuit and process design.

Figure 3:
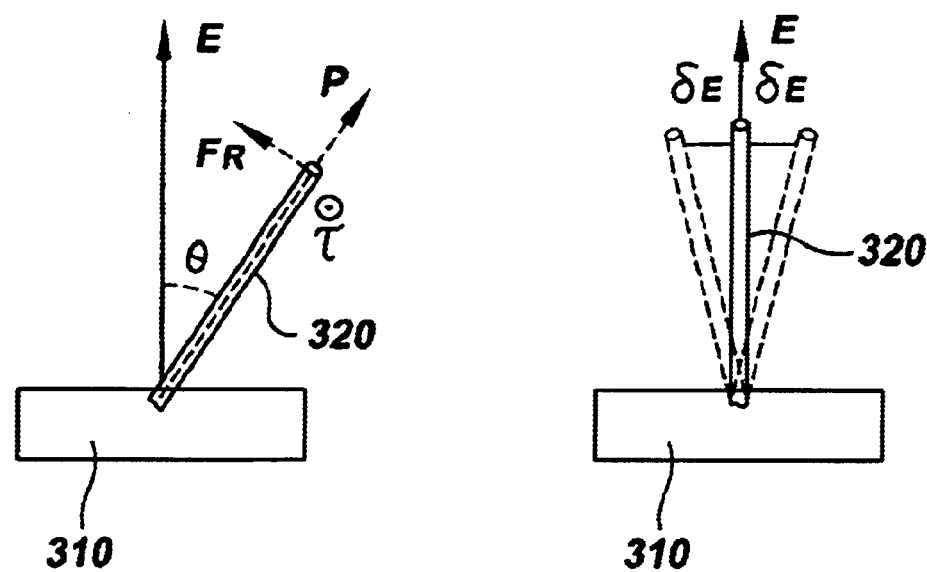
FIG. 3 is a single-walled nanotube in an electric field, according to other example embodiments of the present invention.

FIG. 3 shows SWNT 320 alignment using an electric field, according to another example embodiment of the present invention. A dipole moment P=$\alpha$ E of a SWNT (length=L) is induced by an applied electric field of E, and with a static polarizability tensor $\alpha$ of a long SWNT being highly anisotropic. The polarizability along the tube axis ($\alpha$//) is much higher than that perpendicular to the tube axis ($\alpha\perp$). For metallic SWNTs, $\alpha$// diverges, resulting in infinite dipole moments in electric fields. For semiconducting SWNTs, $\alpha \propto R/E_g^2$, where R and Eg are the radius and band gap of the nanotube, respectively. For both metallic and semiconducting SWNTs, $\alpha$//=4 $\pi\epsilon_0$(0.25R+1.9) L$^2$ (R, L in unit of Å). Due to thermal activation at high growth temperature, significant free carriers exist in the semiconducting SWNTs (KBT/Eg~0.2). Using this approach and the above equations, theoretical results of the application of an electric field to carbon nanotubes, such as discussed above, are determined and used for electric field directed growth of SWNTs. In one instance, the strength of the electric field applied to the SWNTs is selected to achieve orientation of the carbon nanotubes using the equations above.

In one implementation, the SWNT 320 is grown from an elevated polysilicon structure 310, such as cliff, and the SWNT extends over a trench (e.g., as shown in FIG. 2D) in which the electric field is E. For a nanotube oriented at an angle $\theta$ with respect to E (e.g., as shown in FIG. 3), the dipole moment of the SWNT 320 is along the tube axis with P$\approx$($\alpha$//)$\times$Ecos $\theta$, except for $\theta$ close to 90°. The torque on the dipole moment is about $\tau$=|P$\times$E|=($\alpha$//f)=E$^2$ sin $\theta$ cos $\theta$. Correspondingly, the force applied on the dipole to rotate and align the tube with E is FR=($\alpha$//)=E$^2$ sin $\theta$ cos $\theta$/L. In the instance where the SWNT 320 has L=20 microns in an applied field of E=1 V/$\mu$m, the torque is $\tau$=0.02 sin $\theta$ cos $\theta$ (in nN $\mu$m) and the aligning force is FR=1.0$\times$sin $\theta$ cos $\theta$ (in $\mu$N).

In the instance of a SWNT oriented along the electric field with one-end-fixed on a cliff and the rest of the length floating, as shown with SWNT 320 extending from structure 310 in FIG. 3, there are several potential factors that can potentially randomize the orientation of the SWNT 320. In this regard, the application of the electric field E is selected to overcome one or more of these potential factors in various example implementations of the present invention. One such potentially randomizing factor is thermal randomization. In the absence of an electric field, the thermal vibration amplitude of the floating end of a SWNT is $\delta=\{0.846L^3KT/[YdG(d^2+G^2)]\}^{1/2} L^{3/2}$,[15] where T=1173 K, Y=1.0 TPa is the Young's modulus, d=2R=2 nm is the diameter, and G=0.34 nm is the van der Waals distance in graphite. This gives rise to a thermal vibration of $\delta\sim 6.3$ microns for an L=20 micron tube at the growth temperature (e.g., 900° C.). In an electric field, the vibration amplitude of the free end of the SWNT is $\delta E = L[KBT/U_E]_{1/2} = L[KBT/(\alpha//E^2)]^{1/2}$, which is proportional to 1/E and independent of L (due to $\alpha//\sim L^2$, and where $U_E=\alpha//E^2$ is the potential energy of the nanotube dipole when aligned with the electric field). For a SWNT with R~1 nm and L=20 $\mu$m, it has been discovered that the thermal vibration amplitude of its free end is only $\delta E \sim 0.57$ $\mu$m in an electric field of 1 V/micron, which is significantly smaller than the length of the tube, indicating negligible thermal randomization of the SWNT alignment from the electric field. It has further been discovered that using an electric field E of between about 0.5–2 V/micron is particularly useful for achieving alignment while overcoming difficulties with other applied fields, including difficulties with thermal randomization.

In another example embodiment of the present invention, the electric field E and orientation of a wafer from which carbon nanotubes are grown are both selected to overcome randomization caused by the flow of gas in a CVD system being used, for example, for CVD growth of SWNTs. A wafer is positioned in a CVD chamber in such a way that trenches on the wafer over which carbon nanotubes are to be grown are parallel to the gas flow direction. That is, SWNTs grown are aligned with the electric field direction and perpendicular to the gas flow. In one implementation, the alignment is viewed using SEM, such as for inspecting the manufacture of the SWNTs, where SEM can be carried out without necessarily coating the samples with metal.

In connection with another example embodiment of the present invention, it has been discovered that cliffs (e.g., small elevated structures) on a substrate are particularly useful for manufacturing aligned carbon nanotubes. The cliffs have been found to inhibit growing nanotubes from contacting the substrate, which is advantageous because strong van der Waals interactions with the substrate can hold growing nanotubes in place, preventing response to the electric field. Therefore, the cliffs can be used to maintain the nanotubes in a floating arrangement (e.g., free from interactions with surfaces), such that the nanotubes can respond freely to the electric field aligning effect, resulting in parallel nanotubes extending from the cliff. These parallel nanotubes can then fall onto the substrate after completion of growth for implementation in a variety of applications.

FIG. 4 is a system 400 for electric-field directed growth of carbon nanotubes, according to another example embodiment of the present invention. The system includes a furnace chamber 410, such as a tube furnace, having electrical feedthrough at inlet 412 and a gas inlet 414 and adapted for heating a substrate to about 900 degrees Celsius. An insulating fixture 420, such as a ceramic fixture, is arranged for mounting of a substrate 405 thereto. Catalyst-containing structures 402 and 404 are formed on the substrate 405, and electrode clamps 422 and 424 clamp over the catalyst-containing structures. Each of the electrode clamps 422 and 424 are electrically coupled via the feedthrough inlet 412 and wires 432 and 434, respectively, to a voltage-application device 430. Gas inlet 414 is configured and arranged for introducing a methane-containing gas to the substrate 405, with the voltage-application device 430 simultaneously applying a voltage via the electrode clamps 422 and 424, forming an electric field therebetween. The electric field is sufficiently strong (e.g., 1–2 V/micron) to orient carbon nanotubes 440 grown from the catalyst-containing structures 402 and 404, using the methane-containing gas introduced via inlet 414.

Experimental Data

Figure 5A:
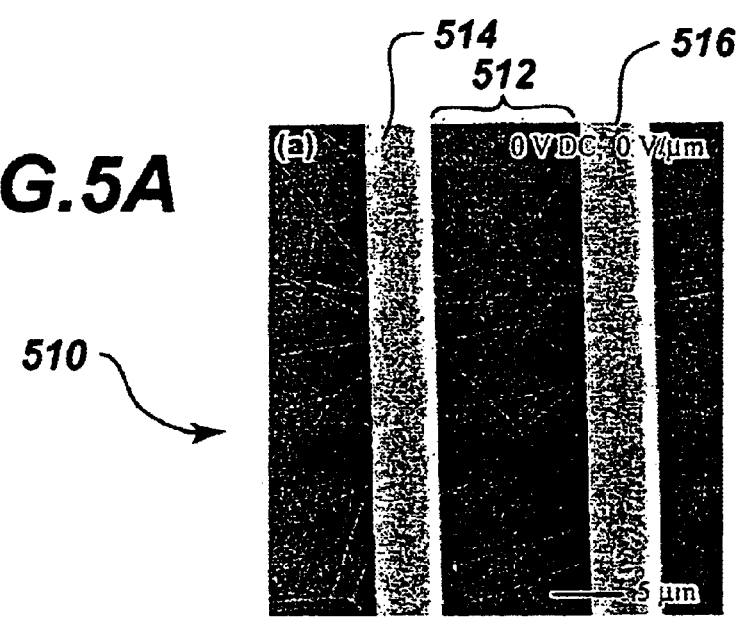
FIG. 5 shows suspended single-walled nanotubes grown in various electric fields in connection with other example embodiments of the present invention.
Figure 5B:
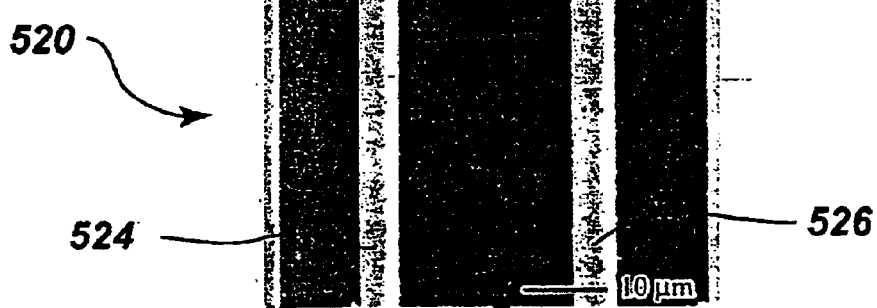
Figure 5C:
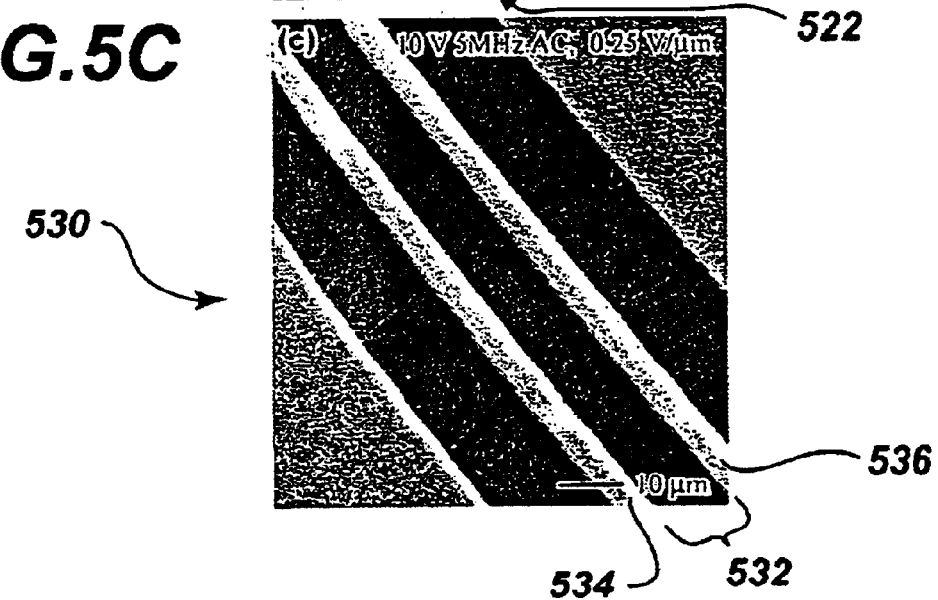

FIG. 5 shows example SWNTs that may be grown in connection with one or more example embodiments and implementations of the present invention, such as those discussed above. The SWNTs in portion 510 are grown under about zero applied electric field and exhibit no preferred orientation and appear randomly suspended over the trenches, forming a disordered SWNT network. Region 512, for example, shows lighter SWNTs on a black background extending between structures 514 and 516. The SWNTs in portions 520 and 530, respectively, are grown under bias voltages of 5 V and 10 V and exhibit an appreciable degree of alignment along the direction of an electric field. Region 522, for example, shows lighter SWNTs on a black background extending between structures 524 and 526. Similarly, region 532 shows lighter SWNTs on a black background extending between structures 534 and 536. The structure in portion 530 may, for example, correspond to the structure 200 in FIG. 2D, with structures 534 and 536 corresponding to polysilicon film portions 221 and 222, respectively. The corresponding electric fields are on the order of 0.1–0.25 V/micron. In this relatively low bias voltage regime (e.g., about 10 V), it has been discovered that both DC and AC fields can be used to direct the growth of SWNTs and obtain similar results.

Figure 6A:
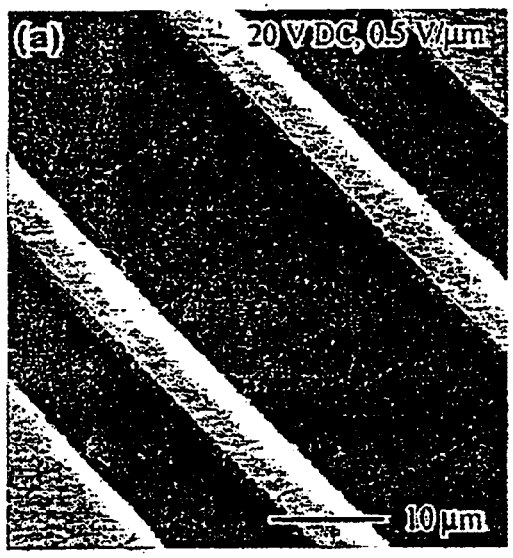
FIG. 6 shows suspended single-walled nanotubes grown in various electric fields in connection with other example embodiments of the present invention.
Figure 6B:
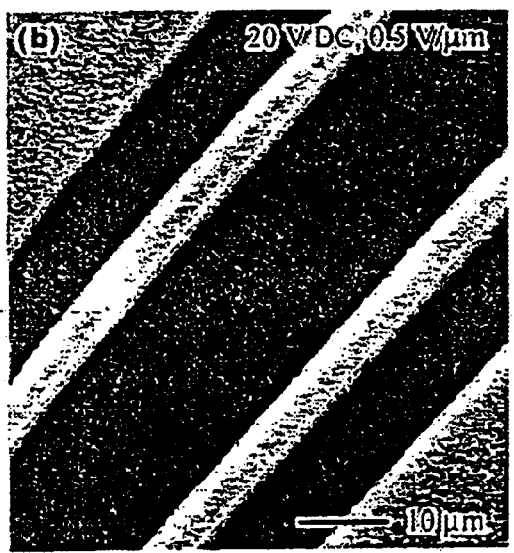
Figure 6C:
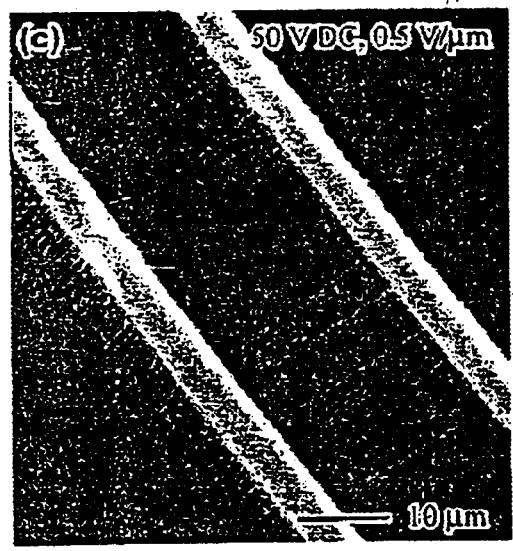

FIG. 6 shows typical growth results obtained under conditions conducive to the growth of highly aligned suspended SWNTs (e.g., under electric fields in the range of 0.5 V/micron–2 V/micron (bias voltages~20–200 volts)), formed in connection with one or more example embodiments and implementations of the present invention, such as those discussed above. With this approach, relatively long (e.g., greater than 10 micron) SWNTs are well aligned along the electric field direction. Portions 610 and 620 show SWNTs grown under an electric field of about 0.5V/micron with a DC bias voltage of about 20V. Portion 630 show SWNTs grown under an electric field of about 0.5V/micron with a DC bias voltage of about 50V.

FIG. 7 shows SEM images 710 and 720 of SWNTs grown in a trench that may be formed in connection with one or more example embodiments and implementations of the present invention, such as those discussed above. In this instance, the carbon nanotubes were not coated with metal, an insulating substrate (e.g., quartz) over which they are formed appears as bright background due to electrical charging, and the SWNTs appear as dark lines extending relatively horizontally in each image.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include modifying the nanotubes for selected applications, altering the arrangement and orientation of the nanotubes, interchanging nanotube films and single nanotubes, and where appropriate, using SWNTs as building blocks for more complex devices, such as MWNTs. Furthermore, the nanotubes may include materials other than carbon, such as silicon and/or boron, which also may be grown using a synthesis process similar to that described above. In addition, for general information regarding carbon nanotubes, and for specific information regarding implementations and applications to which various example embodiments of the present invention may be applied, reference may be made to the attached Appendices A and B, respectively entitled "Electric field growth of single-walleded carbon nanotubes on surfaces" and "Electric-field-directed growth of aligned single-walleded carbon nanotubes," both of which are fully incorporated herein by reference. Such modifications and changes do not depart from the true spirit and scope of the present invention, which is set forth in the following claims.

What is claimed is:

1. A method for manufacturing a carbon nanotube device, the method comprising applying an electric field and aligning a carbon nanotube with the electric field.

2. The method of claim 1, wherein applying an electric field includes applying an electric field to the carbon nanotube after it is grown.

3. The method of claim 1, wherein applying an electric field includes applying an electric field while simultaneously growing the carbon nanotube.

4. The method of claim 3, wherein growing the carbon nanotube includes growing the carbon nanotube extending from a raised structure on a surface.

5. The method of claim 4, wherein growing the carbon nanotube includes growing the carbon nanotube on the surface and extending between said raised structure and a second raised structure on the surface.

6. A method for manufacturing a carbon nanotube, the method comprising:
   inducing a dipole moment adapted to effect an aligning torque on a wall structure of a carbon nanotube; and
   using the induced dipole moment for alignment and forming a carbon nanotube.

7. The method of claim 6, wherein forming a carbon nanotube includes forming a plurality of carbon nanotubes and wherein inducing a dipole moment includes effecting an aligning torque on each of the plurality of carbon nanotubes as they are grown, the aligning torque being sufficient to inhibit alignment randomization of the orientation of the plurality of carbon nanotubes.

8. The method of claim 7, wherein effecting an aligning torque includes effecting an aligning torque that sufficient to inhibit alignment randomization due to at least one of: thermal fluctuations and the flow of gas near the carbon nanotube.

9. The method of claim 6, wherein the wall structure is a single wall structure and wherein inducing a dipole moment includes applying an electric field of at least about 1 volt/micron to the carbon nanotube as it is grown.

10. The method of claim 6, further comprising forming a first raised structure on a substrate surface, wherein forming a carbon nanotube includes forming a carbon nanotube from the raised structure.

11. The method of claim 10, further comprising forming a second raised structure on the substrate surface, wherein forming a carbon nanotube includes forming a carbon nanotube extending between the first and second raised structures.

12. The method of claim 11, further comprising forming a catalyst material on the first and second raised structures, prior to forming the carbon nanotube, and wherein forming the carbon nanotube includes introducing a carbon-containing gas to the first and second raised structures and reacting the carbon-containing gas to grow the carbon nanotube.

13. The method of claim 12, wherein inducing a dipole moment includes coupling first and second electrodes to the first and second raised structures and applying a voltage across the first and second electrodes.

14. The method of claim 12, wherein forming a catalyst material on the first and second raised structures comprises:
   forming a first layer of material;
   forming a second layer of photoresist material over the first layer, patterning the second layer using photolithography and forming openings therein that expose portions of the first layer;
   etching the exposed portions of the first layer and forming wells therein;
   removing the second layer of photoresist material; and
   forming the catalyst material in the wells of the first layer.

15. The method of claim 14, wherein forming a first layer of material includes forming a first layer of material that is resistant to a solvent used to carry the catalyst material in suspension and wherein forming the catalyst material in the wells of the first layer includes depositing catalyst material from a methanol suspension.

16. The method of claim 11, wherein forming the carbon nanotube includes forming the carbon nanotube on the substrate surface while using the induced dipole moment for alignment of the carbon nanotube.

17. The method of claim 16, wherein forming the carbon nanotube comprises:
   at a first stage of carbon nanotube growth, growing the carbon nanotube extending over the substrate surface and aligning the carbon nanotube with the induced dipole moment; and
   at a second stage of carbon nanotube growth, after aligning the carbon nanotube at the first stage, allowing the carbon nanotube to fall to the substrate.

18. A method for manufacturing a carbon nanotube device, the method comprising:
   forming a layer of conductive material on an insulative substrate;
   etching a trench in the layer of conductive material and exposing the insulative substrate at the bottom of the trench;
   forming catalyst material on portions of the layer of conductive material at opposing sides of the trench;
   coupling electrical leads to the conductive material at opposite sides of the trench and applying an electric field across the trench via the electrical leads; and
   using the electric field for alignment, heating the substrate while introducing molecules to the catalyst material and growing an aligned carbon nanotube extending from the catalyst material and across the trench, the carbon nanotube extending in a direction aligned with the electric field.

19. The method of claim 18, further comprising removing organic components from the layer of conductive material, prior to growing an aligned carbon nanotube.

20. The method of claim 18, wherein growing an aligned carbon nanotube includes growing an aligned carbon nanotube that electrically couples the catalyst material at opposing sides of the trench.

21. The method of claim 20, further comprising electrically coupling the carbon nanotube to an integrated circuit.

22. The method of claim 20, further comprising electrically coupling detection circuitry across the carbon nanotube, the detection circuitry being configured and arranged for detecting an electrical characteristic of the carbon nanotube.

23. The method of claim 22, wherein electrically coupling detection circuitry across the carbon nanotube includes electrically coupling circuitry configured and arranged to detect a change in an electrical characteristic of the carbon nanotube in response to the carbon nanotube being exposed to a particular molecular species and to thereby detect the presence of the particular molecular species.

24. The method of claim 18, wherein introducing molecules to the catalyst material includes flowing a gas to the catalyst material, further comprising orienting the insulative substrate so that the trench is perpendicular to the gas flow, prior to growing an aligned carbon nanotube.

25. A method for manufacturing a carbon nanotube, the method comprising:

providing a polysilicon film structure on an insulative substrate, the polysilicon film structure having parallel trenches separated by polysilicon lines and having polysilicon pads on opposite sides of the parallel trenches;

forming a liquid-phase catalyst precursor film on an upper surface of the polysilicon film;

calcining the polysilicon film structure and removing organic components therefrom;

placing the substrate on an insulating structure in a chemical vapor deposition (CVD) chamber;

electrically coupling the polysilicon pads to metal leads and applying a voltage to the pads to establish an electric field across the trenches, the electric field being adapted to align carbon nanotubes as they are being formed; and heating the chamber, introducing a gas comprising methane and hydrogen to the polysilicon structure and forming carbon nanotubes extending between the upper surfaces of the polysilicon separated by the trenches, the carbon nanotubes being suspended over the trenches and aligned with the electric field.

26. The method of claim 25, wherein forming carbon nanotubes includes forming single-walleded carbon nanotubes.

27. The method of claim 25, wherein forming the liquid-phase catalyst precursor film includes contact printing the catalyst precursor film.

28. The method of claim 25, wherein calcining the polysilicon film includes forming mesoporous alumina frames on the polysilicon, wherein nanoparticles of the catalyst are supported on the mesoporous alumina frames.

29. The method of claim 25, wherein applying a voltage to the pads includes applying a voltage adapted to establish an electric field of at least about 1 volt/micron across the trenches.

30. The method of claim 25, wherein heating the chamber and introducing a gas comprising methane and hydrogen includes heating the chamber to about 900 degrees Celsius and introducing methane at a flowrate of about 500 sccm and hydrogen at a flowrate of about 200 sccm for about 4 minutes.

31. A method for manufacturing a carbon nanotube device, the method comprising: forming an insulative substrate on a wafer;

forming metal electrodes on the insulative substrate;

forming catalyst material on the metal electrodes; and simultaneously applying an electric field to the device while growing an aligned carbon nanotube extending between the metal electrodes, wherein forming an insulative substrate on a wafer and applying an electric field to the device includes forming the insulative substrate and applying the electric field in a manner that inhibits van der Waals binding of the aligned carbon nanotube during nanotube growth while achieving orientation of the nanotube with the electric field.

* * * * *

UNITED STATES PATENT AND TRADEMARK OFFICE
CERTIFICATE OF CORRECTION

PATENT NO. : 6,837,928 B1
DATED : January 4, 2005
INVENTOR(S) : Zhang et al.

It is certified that error appears in the above-identified patent and that said Letters Patent is hereby corrected as shown below:

Title page,
Under Item [57], "31 Claims, 8 Drawing Sheets" should read -- 37 Claims, 8 Drawing Sheets --.

Column 1,
Line 12, "(STFD.021PA/S98-049)" should read -- now U.S. Patent No. 6,346,948 --.
After line 16, should be inserted
                 -- Federally-Sponsored Research or Development This invention was made with Government support under the following contracts:
MDA 972-01-1-0035 awarded by the Defense Advanced Research Projects Agency; and N00014-01-0651 awarded by the Department of the Navy. The U.S. Government has certain rights in this invention. --.
Line 30, "single-walleded" should read -- single-walled --.
Line 37, "Single-walleded" should read -- Single-walled --.

Column 5,
Line 3, "1 14" should read -- I14 --.
Line 47, "225" should read -- 226 --.
Line 52, "231" should read -- 232 --.

Column 6,
Line 37, "$\pi \epsilon_o$" should read -- $\pi \varepsilon_o$ --.
Line 54, "$(\alpha//f)=E^2$" should read -- $(\alpha/1)x\ E^2$ --.
Line 56, "$(\alpha//)=E^2$" should read -- $(\alpha//)x\ E^2$ --.

UNITED STATES PATENT AND TRADEMARK OFFICE
CERTIFICATE OF CORRECTION

PATENT NO.    : 6,837,928 B1
DATED         : January 4, 2005
INVENTOR(S)   : Zhang et al.

It is certified that error appears in the above-identified patent and that said Letters Patent is hereby corrected as shown below:

Column 7,
Line 11, "$U_{E]1/2}=$" should read -- $U_E]^{1/2}$ --.

Signed and Sealed this

Eleventh Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,837,928 B1
DATED : January 4, 2005
INVENTOR(S) : Zhang et al.

It is certified that error appears in the above-identified patent and that said Letters Patent is hereby corrected as shown below:

Title page,
Under Item [57], "31 Claims, 8 Drawing Sheets" should read -- 37 Claims, 8 Drawing Sheets --.

Column 1,
Line 12, "(STFD.021PA/S98-049)" should read -- now U.S. Patent No. 6,346,948 --.
Line 17, insert:
-- Federally-Sponsored Research or Development This invention was made with Government support under the following contracts: MDA 972-01-1-0035 awarded by the Defense Advanced Research Projects Agency; and N00014-01-0651 awarded by the Department of the Navy. The U.S. Governement has certain rights in this invention. --.
Line 30, "single-walleded" should read -- single-walled --.
Line 37, "Single-walleded" should read -- Single-walled --.

Column 5,
Line 3, "1 14" should read -- I14 --.
Line 47, "225" should read -- 226 --.
Line 52, "231" should read -- 232 --.

Column 6,
Line 37, "$\pi\epsilon_o$" should read -- $\pi\varepsilon_o$ --.
Line 54, ($\alpha//f$)=$E^2$" should read -- ($\alpha/1$)x $E^2$ --.
Line 56, ($\alpha//$)=$E^2$" should read -- ($\alpha//1$)x $E^2$ --.

Column 7,
Line 11, "$U_{E]1/2}=$" should read -- $U_E]^{1/2}$ --.

Column 12,
Line 38, insert:
-- 32. A system for manufacturing a carbon nanotube, the system comprising;
means for inducing a dipole moment adapted to effect an aligning torque on a wall structure of a carbon nanotube; and
a carbon nanotube growth furnace configured and arranged for using the induced dipole moment for alignment and for forming the carbon nanotube.

UNITED STATES PATENT AND TRADEMARK OFFICE
CERTIFICATE OF CORRECTION

PATENT NO. : 6,837,928 B1
DATED : January 4, 2005
INVENTOR(S) : Zhang et al.

It is certified that error appears in the above-identified patent and that said Letters Patent is hereby corrected as shown below:

Column 12 (cont'd),
33. A system for manufacturing a carbon nanotube, the system comprising;
   electrodes configured and arranged for inducing a dipole moment adapted to effect an aligning torque on a wall structure of a carbon nanotube; and
   a carbon nanotube growth furnace configured and arranged for using the induced dipole moment for alignment and for forming the carbon nanotube.

34. A carbon nanotube device comprising:
   a substrate having an insulative layer thereon;
   at least two electrodes on the insulative layer and adapted for applying an electric field for alignment of a carbon nanotube extending therebetween;
   an aligned carbon nanotube extending between the at least two electrodes and on
   the insulative layer; and wherein the insulative layer is resistant to electrical breakdown under voltages applied across the at least two electrodes for aligning the carbon nanotube.

35. The carbon nanotube device of claim 34, further comprising a layer of material over the aligned carbon nanotube, wherein the aligned carbon nanotube is adapted for implementation involving the formation of the layer of material without post-growth alignment of the carbon nanotube.

36. An aligned carbon nanotube having characteristics inherent of a carbon nanotube grown using an electric field for alignment.

UNITED STATES PATENT AND TRADEMARK OFFICE
CERTIFICATE OF CORRECTION

PATENT NO. : 6,837,928 B1
DATED : January 4, 2005
INVENTOR(S) : Zhang et al.

It is certified that error appears in the above-identified patent and that said Letters Patent is hereby corrected as shown below:

<u>Column 12 (cont'd),</u>
37. The aligned carbon nanotube of claim 36, wherein the carbon nanotube is disposed on the surface of a substrate. --.

This certificate supersedes Certificate of Correction issued October 11, 2005.

Signed and Sealed this

Twenty-ninth Day of November, 2005

JON W. DUDAS
*Director of the United States Patent and Trademark Office*